United States Patent
Takeda et al.

(10) Patent No.: US 9,203,028 B2
(45) Date of Patent: *Dec. 1, 2015

(54) METHOD FOR PRODUCING VAPOR DEPOSITION MASK, AND METHOD FOR PRODUCING ORGANIC SEMICONDUCTOR ELEMENT

(71) Applicant: DAI NIPPON PRINTING CO., LTD., Tokyo (JP)

(72) Inventors: Toshihiko Takeda, Tokyo (JP); Hiroyuki Nishimura, Tokyo (JP); Katsunari Obata, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/370,875

(22) PCT Filed: Jan. 11, 2013

(86) PCT No.: PCT/JP2013/050423
§ 371 (c)(1),
(2) Date: Jul. 7, 2014

(87) PCT Pub. No.: WO2013/105643
PCT Pub. Date: Jul. 18, 2013

(65) Prior Publication Data
US 2014/0377903 A1 Dec. 25, 2014

(30) Foreign Application Priority Data
Jan. 12, 2012 (JP) .................... 2012-004486

(51) Int. Cl.
| | | |
|---|---|---|
| H01L 51/40 | (2006.01) |
| H01L 51/00 | (2006.01) |
| C23C 14/04 | (2006.01) |
| C23C 16/04 | (2006.01) |
| C23F 1/02 | (2006.01) |
| C23F 1/12 | (2006.01) |
| C23F 1/14 | (2006.01) |
| H01L 51/56 | (2006.01) |

(52) U.S. Cl.
CPC .......... *H01L 51/0011* (2013.01); *C23C 14/042* (2013.01); *C23C 16/042* (2013.01); *C23F 1/02* (2013.01); *C23F 1/12* (2013.01); *C23F 1/14* (2013.01); *H01L 51/56* (2013.01)

(58) Field of Classification Search
CPC .................................................... H01L 51/0011
See application file for complete search history.

(56) References Cited

U.S. PATENT DOCUMENTS

| | | | | |
|---|---|---|---|---|
| 5,792,520 | A * | 8/1998 | Yamashita et al. ............ | 427/555 |
| 2007/0148337 | A1* | 6/2007 | Nichols et al. ............... | 427/98.4 |
| 2008/0038935 | A1* | 2/2008 | Baude et al. .................. | 438/759 |
| 2009/0229638 | A1* | 9/2009 | Yun et al. ........................ | 134/26 |
| 2010/0021119 | A1* | 1/2010 | Ohtsu et al. ................... | 385/130 |
| 2014/0146391 | A1* | 5/2014 | Jang et al. ................ | 359/485.05 |
| 2015/0017759 | A1* | 1/2015 | Hirobe et al. .................. | 438/99 |
| 2015/0037928 | A1* | 2/2015 | Hirobe et al. .................. | 438/99 |

FOREIGN PATENT DOCUMENTS

| | | |
|---|---|---|
| JP | 07-300664 | 11/1995 |
| JP | 2003-332057 | 11/2003 |
| JP | 2004-190057 | 7/2004 |
| JP | 2008-121060 | 5/2008 |

OTHER PUBLICATIONS

International Search Report, PCT/JP2013/050423, Feb. 19, 2013.

* cited by examiner

*Primary Examiner* — Alexander Ghyka
(74) *Attorney, Agent, or Firm* — Young & Thompson

(57) ABSTRACT

A method for producing a vapor deposition mask capable of satisfying both enhancement in definition and reduction in weight even when a size is increased, and a method for producing an organic semiconductor element capable of producing an organic semiconductor element with high definition are provided. A vapor deposition mask is produced by the steps of preparing a metal plate with a resin layer in which a resin layer is provided on one surface of a metal plate, forming a metal mask with a resin layer by forming a slit that penetrates through only the metal plate, for the metal plate in the metal plate with a resin layer, and thereafter, forming a resin mask by forming openings corresponding to a pattern to be produced by vapor deposition in a plurality of rows lengthwise and crosswise in the resin layer by emitting a laser from the metal mask side.

12 Claims, 7 Drawing Sheets

METHOD FOR PRODUCING VAPOR DEPOSITION MASK, AND METHOD FOR PRODUCING ORGANIC SEMICONDUCTOR ELEMENT

TECHNICAL FIELD

The present invention relates to a method for producing a vapor deposition mask, and a method for producing an organic semiconductor element.

BACKGROUND ART

Conventionally, in production of an organic EL element, a vapor deposition mask that is composed of a metal formed by a number of microscopic slits being arranged in parallel with one another at microscopic spaces in a region that should be subjected to vapor deposition, for example, has been used in formation of an organic layer of an organic EL element or a cathode electrode. While in the case of using the vapor deposition mask, the vapor deposition mask is placed on a substrate front surface that should be subjected to vapor deposition and is held by using a magnet from a back surface, the rigidity of the slits is extremely small, and therefore, distortion easily occurs to the slits when the vapor deposition mask is held on the substrate front surface, which becomes an obstacle to enhancement in definition or upsizing of the products in which the slit lengths are large.

Various studies have been made on the vapor deposition masks for preventing distortion of slits, and, for example, Patent Literature 1 proposes a vapor deposition mask including a base plate that also serves a first metal mask including a plurality of openings, a second metal mask including a number of microscopic slits in regions to cover the aforementioned openings, and a mask pulling and holding device that positions the second metal mask on the base plate in a state in which the second metal mask is pulled in the longitudinal direction of the slits. Namely, the vapor deposition mask with two kinds of metal masks being combined is proposed. It is indicated that according to the vapor deposition mask, slit precision can be ensured without occurrence of distortion to the slits.

Incidentally, in recent years, with upsizing of the products using organic EL elements or increase in substrate sizes, a demand for upsizing are also growing with respect to vapor deposition masks, and the metal plates for use in production of the vapor deposition masks composed of metals are also upsized. However, with the present metal processing technique, it is difficult to form slits in a large metal plate with high precision, and even if distortion in slit portions can be prevented by the method proposed in the above described Patent Literature 1 or the like, the method or the like cannot respond to enhancement in definition of the slits. Further, in the case of use of a vapor deposition mask composed of only a metal, the mass thereof also increases with upsizing, and the total mass including a frame also increases, which becomes a hindrance to handling.

CITATION LIST

Patent Literature

[Patent Literature 1] Japanese Patent Laid-Open No. 2003-332057

SUMMARY OF INVENTION

Technical Problem

The present invention is made in the light of the situation as above, and has main problems of providing a method for producing a vapor deposition mask that can satisfy both enhancement in definition and reduction in weight even when a size is increased, and of providing a method for producing an organic semiconductor element that can produce the organic semiconductor element with high precision.

Solution to Problem

The present invention for solving the above described problem is a method for producing a vapor deposition mask that is formed by a metal mask provided with a slit, and a resin mask that is positioned on a front surface of the metal mask, and has openings corresponding to a pattern to be produced by vapor deposition arranged by lengthwise and crosswise in a plurality of rows being stacked on each other, and includes the steps of preparing a metal plate with a resin layer in which a resin layer is provided on one surface of the metal plate, forming a metal mask with a resin layer by forming a slit that penetrates through only the metal plate, for the metal plate in the metal plate with a resin layer, and therefore, forming a resin mask by forming the openings corresponding to a pattern to be produced by vapor deposition in a plurality of rows lengthwise and crosswise in the resin layer by emitting a laser from the metal mask side.

In the above described invention, the step of forming the metal mask with a resin layer is a step of forming a resist pattern by coating a surface where a resin layer is not provided, of the metal plate with a resin layer with a resist material, masking the resist material with use of a mask in which a slit pattern is formed, and forming a resist pattern to performing exposure and development, subjecting the metal plate to etching processing with use of the resist pattern as an etching resistant mask, and cleaning and removing the resist pattern after etching is finished.

Further, on the other hand, in the invention described above, the resist pattern may be allowed to remain as it is without being cleaned and removed.

Further, after the step of forming the metal mask with a resin layer, the step of fixing the metal mask with a resin layer onto a frame containing a metal is further included, and after the metal mask with a resin layer is fixed to the frame, the step of forming the resin mask may be performed.

Further, the present invention for solving the above described problem is a method for producing an organic semiconductor element, wherein the vapor deposition mask that is produced according to the production method having the above described features is used.

Advantageous Effects of Invention

According to the method for producing a vapor deposition mask of the present invention, the vapor deposition mask capable of satisfying both enhancement in definition and reduction in weight even when a size is increased can be produced with high yield. Further, according to the method for producing an organic semiconductor element of the present invention, an organic semiconductor element can be produced with high precision.

DESCRIPTION OF EMBODIMENTS

Hereinafter, a method for producing a vapor deposition mask of the present invention will be specifically described with use of the drawings. Note that in the following explanation, process steps will be mainly described first, and description of a material and the like will be made together when the vapor deposition mask that is produced according to the production method is described.

(First Production Method)

Figure 1:
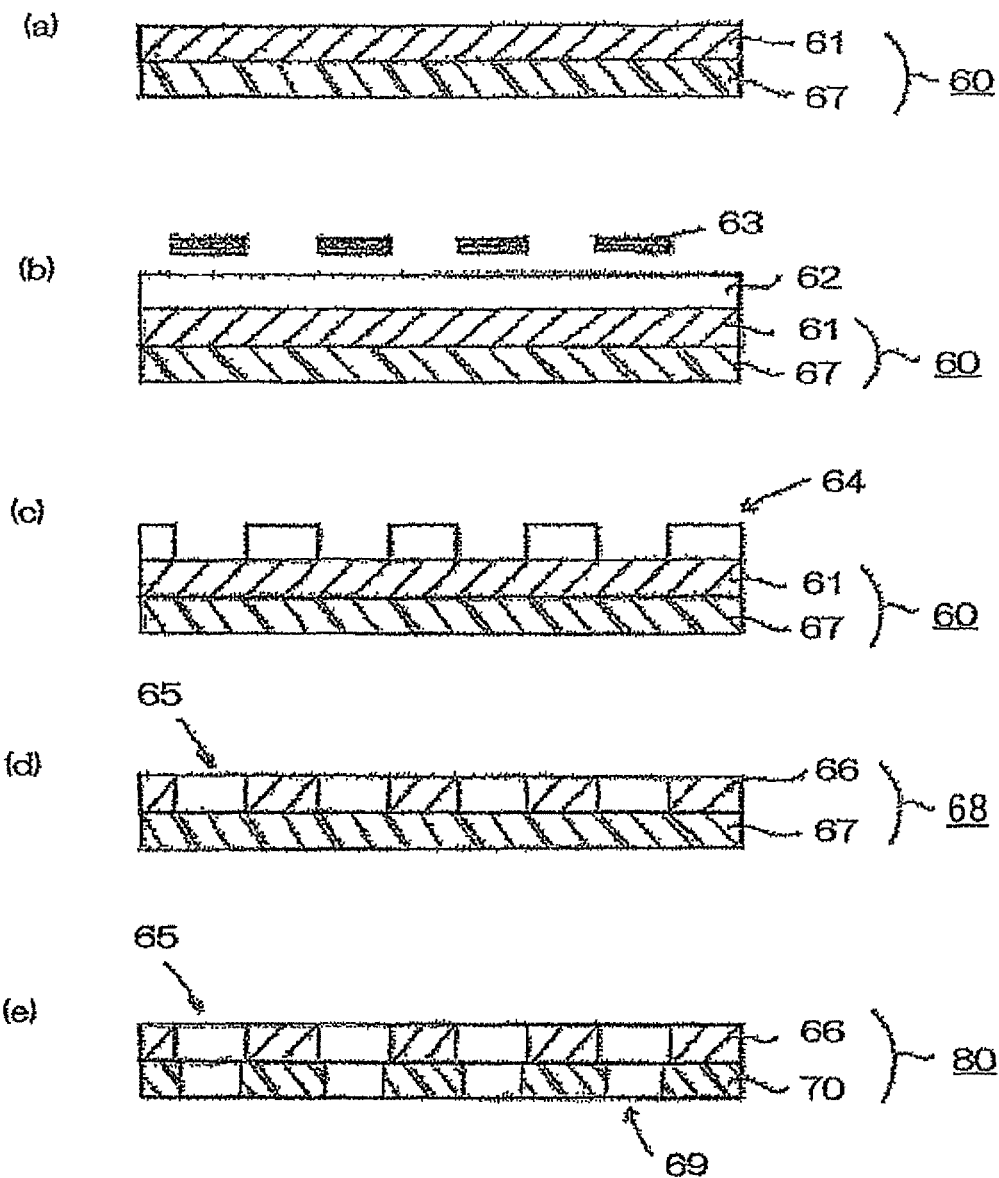
FIG. 1 is a process chart for describing a first production method of the vapor deposition mask of the present invention.

FIG. 1 is a process chart for describing a first production method of the vapor deposition mask of the present invention. Note that (a) to (e) are all sectional views.

As shown in FIG. 1 (a), a metal plate 60 with a resin layer in which a resin layer 67 is provided on one surface of the metal plate 61 is prepared. Here, a method for preparing the metal plate 60 with a resin layer is not specially limited, and the metal plate 60 with a resin layer that is commercially available may be purchased, or the metal plate 60 with a resin layer may be made by providing a resin layer on a front surface of the metal plate. As a method for providing the resin layer on the front surface of the metal plate, the metal plate is coated with a coating solution containing a resin to be a resin layer, and is dried, whereby the metal plate 60 with a resin layer can be obtained. In place of the method, a metal plate with a resin layer also can be obtained by bonding a resin plate onto the metal plate. As the method for bonding the metal plate and the resin plate, various tackiness agents may be used, or a resin plate having self-adhesiveness may be used, for example. Note that it is known that a resin causes change with passage of time for a certain time period after molding, and therefore, a so-called aging time period needs to be provided until the shape is fixed. Since it is conceivable that in the commercially available metal plate 60 with a resin layer, a so-called aging time period has elapsed, use of a commercially available metal plate with a resin layer is preferable from the viewpoint of yield.

Next, slits that penetrate through only the metal plate are formed for a metal plate 61 in the aforementioned metal plate 60 with a resin layer, and thereby a metal mask 68 with a resin layer is formed. The process step in the present method is not specially limited, and may be any process step as long as desired slits can be formed in only the metal mask. The metal mask 68 with a resin layer mentioned in the description of the present application means the metal mask with a resin layer in which slits are formed in the metal plate of the above described metal plate 60 with a resin layer.

FIG. 1 (b) to (d) show an example of the process of forming the metal mask 68 with a resin layer. As shown in FIG. 1 (b), a surface where a resin layer 67 is not provided, of the aforementioned metal plate 60 with a resin layer, is coated with a resist material 62, and the resist material is masked with use of a mask 63 in which a slit pattern is formed, and is exposed and developed. Thereby, as shown in FIG. 1 (c), a resist pattern 64 is formed on a front surface of the metal plate 67. Subsequently, with use of the resist pattern 64 as an etching resistant mask, only the metal plate 60 is subjected to etching processing, and after etching is finished, the aforementioned resist pattern is cleaned and removed. Thereby, as shown in FIG. 1 (d), a metal mask 66 (the metal mask 68 with a resin layer) in which slits 65 are formed in only the metal plate 67 can be obtained.

A method for masking the resist material is not specially limited, and only the surface side of the metal plate 60 with a resin layer where the resin layer 67 is not provided may be coated with the resist material 62, or both surfaces of the metal plate 60 with a resin layer may be coated with the resist material 62 (not illustrated). Further, a dry film method that bonds dry film resist onto the surface of the metal plate 60 with a resin layer, where the resin layer 67 is not provided, or both the surfaces of the metal plate 60 with a resin layer also can be used. The method for coating the resist material 62 is not specially limited, and when only the surface side where the resin layer 67 is not provided, of the metal plate 60 with a resin layer is coated with the resist material 62, a spin coat method, and a spray coat method can be used. Meanwhile, in the case of using the metal plate 60 with a resin layer in a long sheet shape, a dip coat method or the like that can coat a resist material by a roll-to-roll method is preferably used. Note that with a dip coat method, both the surfaces of the metal plate 60 with a resin layer are coated with the resist material 62.

Note that as the resist material, a resist material with excellent treatability and with desired resolution is preferably used. Further, the etching agent for use at the time of etching processing is not specially limited, and a known etching agent can be properly selected.

A method for etching the metal plate 60 is not specially limited, and for example, a wet etching method such as a spray etching method that sprays an etching agent at a predetermined spray pressure from an injection nozzle, an immersion etching method that immerses the metal plate 60 into an etching solution filled with an etching agent, and a spin etching method that drops an etching agent, and a dry etching method using gas, plasma or the like can be used.

Next, a laser is emitted through the slits 65 from the metal mask 66 side of the metal plate 68 with a resin layer, and openings 69 corresponding to a pattern to be produced by vapor deposition are formed in a plurality of rows lengthwise and crosswise in the resin layer 67, whereby a resin mask 70 is made. A laser apparatus that is used here is not specially limited, and a conventionally known laser apparatus may be used. Thereby, a vapor deposition mask 80 as shown in FIG. 1 (e) is obtained. Note that the pattern to be produced by vapor deposition in the description of the present application means a pattern to be produced with use of the vapor deposition mask, and for example, in the case of use of the vapor deposition mask in formation of an organic layer of an organic EL element, the pattern is in a shape of the organic layer. The same shall apply to production methods of other embodiments hereinafter.

(Second Production Method)

Figure 2:
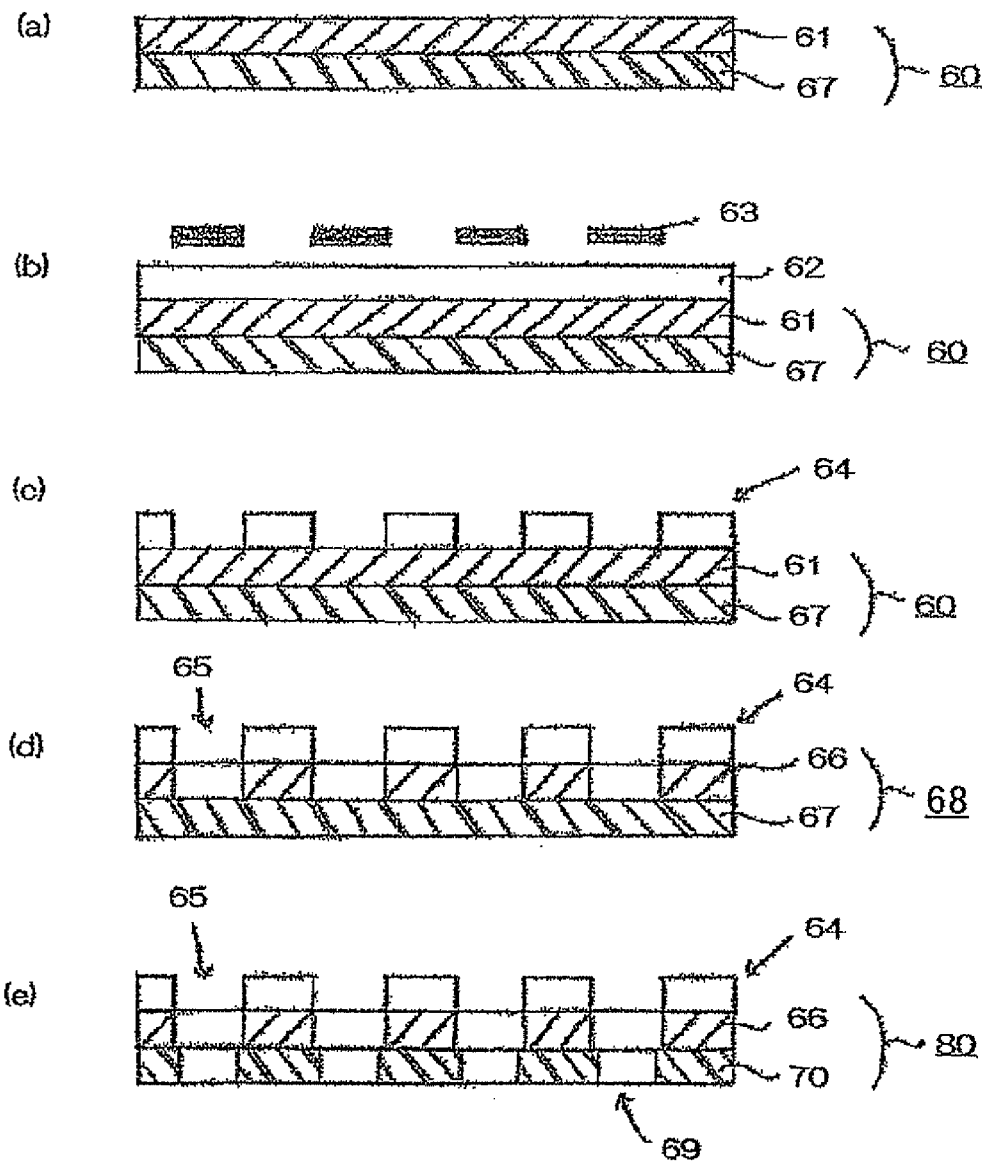
FIG. 2 is a process chart for describing a second method for producing the vapor deposition mask of the present invention.

FIG. 2 is a process chart for describing a second production method of the vapor deposition mask of the present invention. Note that (a) to (e) are all sectional views.

In the first production method shown in FIG. 1, an etching pattern 64 that is used as the etching mask at the time of forming the metal mask 66 is removed, but the etching pattern 64 may be allowed to remain without being removed as shown in FIG. 2 (d) and FIG. 2 (e). The other process steps, namely, FIGS. 2 (a) to (c) are similar to the process steps in FIG. 1, and therefore, explanation will be omitted here.

Note that in the above described first and second production methods, the metal mask 68 with a resin layer may be fixed to a frame containing a metal, after the metal mask 66 (the metal mask 68 with a resin layer) is formed, namely, between (d) and (e) of FIG. 1 and FIG. 2. By fixing the metal mask with a resin layer to a frame at a stage before the openings 69 of the resin mask 70 that controls the pattern shape that is finally produced by vapor deposition are formed, a mounting error that occurs when the vapor deposition mask is fixed to the frame can be made zero. Note that in a conventionally known method, the metal mask in which openings are determined is fixed to the frame while being pulled, and therefore, precision of position coordinates of the openings is reduced.

Further, when the openings 69 are provided in the resin layer of the metal mask 68 with a resin layer in a state fixed to a frame according to a laser processing method, a reference sheet provided in advance with a pattern to be produced by vapor deposition, namely, a pattern corresponding to the openings 69 to be formed is prepared, and laser irradiation corresponding to the pattern on the reference sheet may be performed from the metal mask 66 side, in a state in which the reference sheet is bonded to the surface where the metal mask 66 is not provided, of the metal mask 68 with a resin layer. According to the method, the openings 69 can be formed in the resin layer 67 in a so-called face-to-face state in which laser irradiation is performed while the pattern on the reference sheet bonded to the metal mask 68 with a resin layer is being watched, and the resin mask 70 having the openings 69 with high definition in which the dimensional precision of the openings is extremely high can be formed. Further, in this method, formation of the openings 69 is performed in the state fixed to the frame, and therefore, the vapor deposition mask that is excellent in not only dimensional precision but also in positional precision can be made.

Note that when the above described method is used, the pattern on the reference sheet needs to be recognizable with a laser irradiation apparatus through the resin layer 67 from the metal mask 66 side. As the resin layer 67, use of a resin layer having transparency is needed when the resin layer has a certain degree of thickness, but when the resin layer has a preferable thickness with consideration given to an influence on a shadow as will be described later, for example, a thickness of about 3 μm to 25 μm, the pattern on the reference sheet can be recognized even if the resin layer is a colored resin layer.

A method for bonding the resin layer and the reference sheet is not specially limited. For example, when the metal mask 66 is of a magnetic substance, a magnet or the like is arranged at a rear side of the reference sheet, and the resin layer 67 and the reference sheet can be bonded to each other by being attracted. Besides this, the resin layer 67 and the reference sheet can be bonded with use of an electrostatic adsorbing method or the like. As the reference sheet, a TFT substrate having a predetermined pattern, a photo mask and the like can be cited, for example.

According to each of the first and second production methods of the present invention as above, the vapor deposition mask that can satisfy both enhancement in definition and reduction in weight can be produced with high yield even when the size is increased. Further, according to one embodiment of the present invention, the positional precision of the frame and the vapor deposition mask 100 can be enhanced. Further, by forming the opening 69 with use of the reference sheet, the opening 69 that is extremely excellent in positional precision can be made.

More specifically, in the production method of the present invention, the vapor deposition mask 100 in which the resin mask 70 and the metal mask 66 are stacked is produced. Here, when a mass of the vapor deposition mask 100 that is produced according to the production method of the present invention, and a mass of the vapor deposition mask that is composed of only a metal and is conventionally known are compared on the assumption that thicknesses of the entire vapor deposition masks are the same, the mass of the vapor deposition mask 100 of the present invention is lighter by an amount of a part of the metal material of the conventionally known vapor deposition mask, which is replaced with a resin material. Further, in order to reduce weight by using the vapor deposition mask composed of only a metal, it is necessary to reduce the thickness of the vapor deposition mask, but when the thickness of the vapor deposition mask is reduced, distortion sometimes occurs to the vapor deposition mask, and reduction in durability sometimes occurs when upsizing the vapor deposition mask. Meanwhile, according to the vapor deposition mask according to the present invention, even when the thickness of the entire vapor deposition mask is increased to satisfy distortion and durability at the time of the mask being upsized, reduction in weight can be achieved more than the vapor deposition mask that is formed of only a metal by the presence of the resin mask 70.

Further, in the production method of the present invention, the resin mask 70 is obtained by irradiating the resin layer 67, in which formation of the openings with higher definition is enabled as compared with a metal material, with a laser, and therefore, the vapor deposition mask 100 having the openings 69 with high definition can be produced.

(Slimming Step)

Further, in the production method of the present invention, a slimming step may be performed between the steps described above, or after the steps. The step is an optional step in the production method of the present invention, and is the step of optimizing the thickness of the metal mask 66, and the thickness of the resin mask 70. The preferable thicknesses of the metal mask 66 and the resin mask 70 may be properly set in preferable ranges that will be described later, and the detailed explanation will be omitted here.

For example, when as the metal plate 60 with a resin layer, a metal plate with a resin layer having a certain degree of thickness is used, excellent durability and transportability can be given when the metal plate 60 with a resin layer and the metal mask 68 with a resin layer are transported, and when the vapor deposition mask 100 that is produced according to the above described production method is transported, during the production process. Meanwhile, in order to prevent generation of a shadow or the like, the thickness of the vapor deposition mask 100 that is obtained according to the production method of the present invention is preferably an optimum thickness. The slimming step is a useful step in the case of optimizing the thickness of the vapor deposition mask 100 while satisfying durability and transportability during the production process or after the process.

Slimming of the metal plate 61 to be the metal mask 66 and the metal mask 66, namely, optimization of the thickness of the metal mask can be realized by etching the surface at the side that is not in contact with the resin layer 67, of the metal plate 61, or the surface at the side that is not in contact with the resin layer 67 or the resin mask 70, of the metal mask 66 by using the etching agent capable of etching the metal plate 61 and the metal mask 66, between the steps described above, or after the steps.

Slimming of the resin layer 67 to be the resin mask 70 and the resin mask 70, namely, optimization of the thicknesses of the resin layer 67 and the resin mask 70 is similar to the above, and can be realized by etching the surface at the side that is not in contact with the metal plate 61 and the metal mask 66, of the resin layer 67, or the surface at the side that is not in contact with the metal mask 66, of the resin mask 70 by using the etching agent capable of etching the materials of the resin layer 67 and the resin mask 70 between any of the steps described above, or after the steps. Further, after the vapor deposition mask 100 is formed, both the metal mask 66 and the resin mask 70 are subjected to etching processing, whereby the thicknesses of both of them also can be optimized.

In the slimming step, the etching agent for etching the resin layer 67 or the resin mask 70 can be properly set in accordance with the resin material of the resin layer 67 or the resin mask 70, and is not specially limited. For example, when a polyimide resin is used as the resin material for the resin layer 67 or the resin mask 70, an alkali aqueous solution in which sodium hydroxide or potassium hydroxide is dissolved, hydrazine and the like can be used, as the etching agent. As the etching agent, a commercially available product also can be directly used, and as the etching agent for a polyimide resin, TPE3000 made by Toray Engineering Co., Ltd. or the like is usable.

(Vapor Deposition Mask Produced According to First Production Method)

Figure 3:
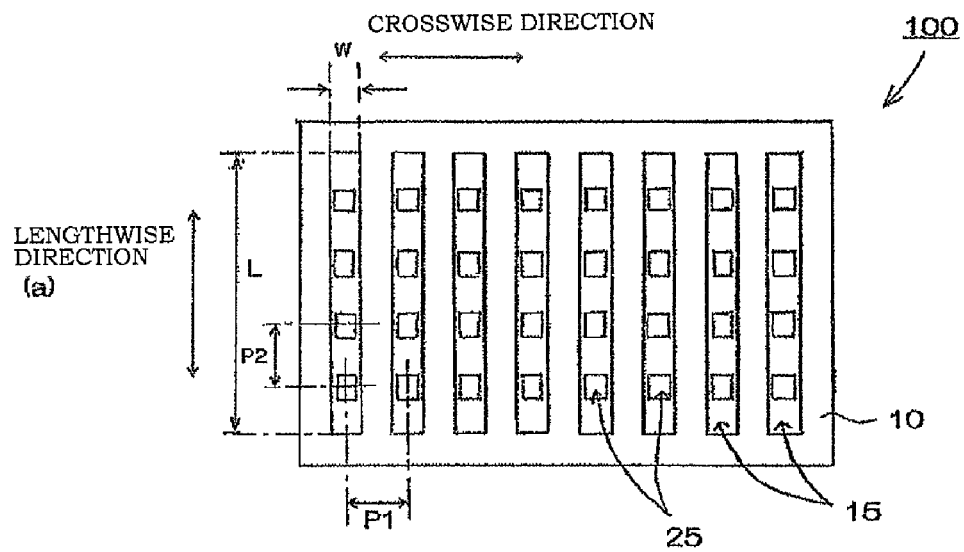
FIG. 3 (a) is a front view of the vapor deposition mask that is produced according to the first production method, seen from a metal mask side, and (b) is an enlarged sectional view of a vapor deposition mask 100 that is produced according to the first production method.
Figure 3:
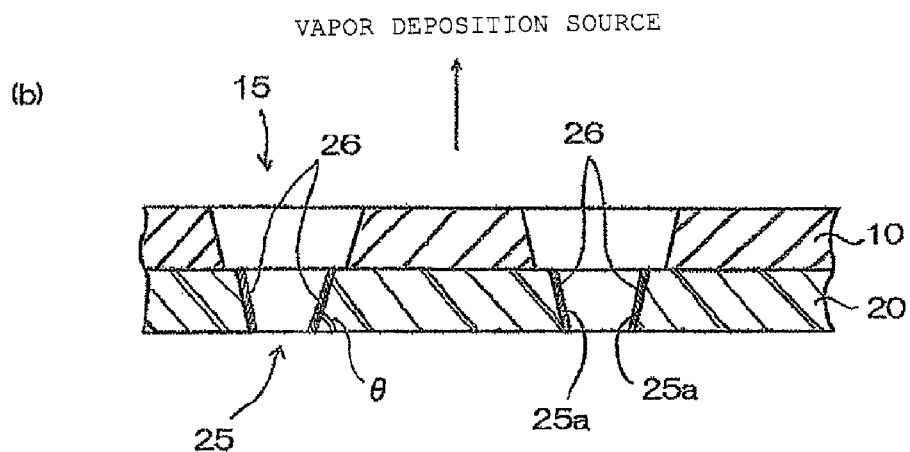

FIG. 3 (*a*) is a front view of the vapor deposition mask produced according to the aforementioned first production method, seen from the metal mask side, and FIG. 3 (*b*) is an enlarged sectional view of the vapor deposition mask 100 produced according to the aforementioned first production method. Note that in these drawings, in order to emphasize the slits provided in the metal mask and the openings provided in the vapor deposition mask, the ratios thereof to the entire body are illustrated to be large. Note that for convenience of explanation, in the forms shown in FIG. 3 to FIG. 6, the metal mask is designated by reference sign 10, and the resin mask is designated by reference sign 20, and the metal mask 10 can be directly replaced with the metal mask 66 described in the production method of the above described present invention, whereas the resin mask 20 can be directly replaced with the metal mask 70 described in the production method of the above described present invention.

As shown in FIG. 3, the vapor deposition mask 100 that is produced according to the first production method of the present invention adopts a configuration in which the metal mask 10 provided with the slits 15, and the resin mask 20 that is positioned on a front surface of the metal mask 10 (an undersurface of the metal mask 10 in the case shown in FIG. 3 (*b*)), and has the openings 25 corresponding to the pattern to be produced by vapor deposition arranged by lengthwise and crosswise in a plurality of rows are stacked. Hereinafter, respective members will be described specifically.

(Resin Mask)

The resin mask 20 is composed of a resin, and as shown in FIG. 3, the openings 25 corresponding to a pattern to be produced by vapor deposition are arranged by lengthwise and crosswise in a plurality of rows at the positions overlapping the slit 15. Further, while in the present invention, the example in which the openings are arranged by lengthwise and crosswise in a plurality of rows is cited and described, the openings 25 can be provided in the positions overlapping the slits, and when the slits are arranged in only a single row in the lengthwise direction or the crosswise direction, the openings 25 can be provided at the positions overlapping the slit 15 in the single row.

For the resin mask 20, a conventionally known resin material can be properly selected and used, and while the material is not especially limited, a material that enables formation of the opening 25 with high definition by laser processing or the like, has a low rate of dimensional change and a low rate of humidity absorption under heat and with passage of time, and is lightweight, is preferably used. As such materials, a polyimide resin, a polyamide resin, a polyamide-imide resin, a polyester resin, a polyethylene resin, a polyvinylalcohol resin, a polypropylene resin, a polycarbonate resin, a polystyrene resin, a polyacrylonitrile resin, an ethylene-vinyl acetate copolymer resin, an ethylene-vinyl alcohol copolymer resin, an ethylene-methacrylic acid copolymer resin, a polyvinyl chloride resin, a polyvinylidene chloride resin, cellophane, an ionomer resin and the like can be cited. Among the materials illustrated in the above, the resin materials with the thermal expansion coefficients of 16 ppm/° C. or less are preferable, the resin materials with rates of humidity absorption of 1.0% or less are preferable, and the resin materials including both the conditions are especially preferable. Accordingly, the resin layers 67 in FIG. 1 and FIG. 2 become the resin masks 20 in the future, and therefore, the resin layers composed of, for example, the preferable resin materials illustrated in the above are preferably used.

While the thickness of the resin mask 20 is not especially limited, the resin mask 20 is preferably as thin as possible in order to prevent occurrence of an insufficient vapor deposition portion, namely, a vapor deposition portion with a film thickness smaller than the intended vapor deposition film thickness, a so-called shadow, in the pattern that is produced by vapor deposition, when vapor deposition is performed with use of the vapor deposition mask of the present invention. However, when the thickness of the resin mask 20 is less than 3 µm, a defect such as a pinhole easily occurs, and the risk of deformation or the like increases. Meanwhile, when the thickness of the resin mask 20 exceeds 25 µm, generation of a shadow can arise. With this point taken into consideration, the thickness of the resin mask 20 is preferably from 3 µm to 25µ inclusive. By setting the thickness of the resin mask 20 within this range, the defect such as a pinhole and the risk of deformation or the like can be reduced, and generation of a shadow can be effectively prevented. In particular, the thickness of the resin mask 20 is set to be from 3 µm to 10 µm inclusive, more preferably, from 4 µm to 8 µm inclusive, whereby the influence of a shadow at the time of forming a high-definition pattern exceeding 300 ppi can be prevented more effectively. Accordingly, the resin layers 67 in FIG. 1 and FIG. 2 become the resin masks 20 in the future, and therefore, the thicknesses of the resin layers 67 are preferably set at the thicknesses described above. Note that the resin layer 67 may be joined to the metal plate via a tackiness agent layer or an adhesive agent layer, or the resin layer 67 and the metal plate may be directly joined to each other, but when the resin layer and the metal plate are joined to each other via a tackiness agent layer or an adhesive agent layer, the total thickness of the resin layer 67 and the tackiness agent layer, or the resin layer 67 and the adhesive agent layer is preferably set to be within a range from 3 µm to 25 µm inclusive in consideration of the shadow described above.

The shape and the size of the opening 25 are not especially limited, and can be the shape and the size corresponding to the pattern to be produced by vapor deposition. Further, as shown in FIG. 2 (a), a pitch P1 in a crosswise direction of the adjacent openings 25, and a pitch P2 in a lengthwise direction can be also properly set in accordance with the pattern to be produced by vapor deposition. Accordingly, when the openings are formed by laser irradiation in FIG. 1 and FIG. 2, the above described pitches P1 and P2 may be properly designed.

Figure 5:
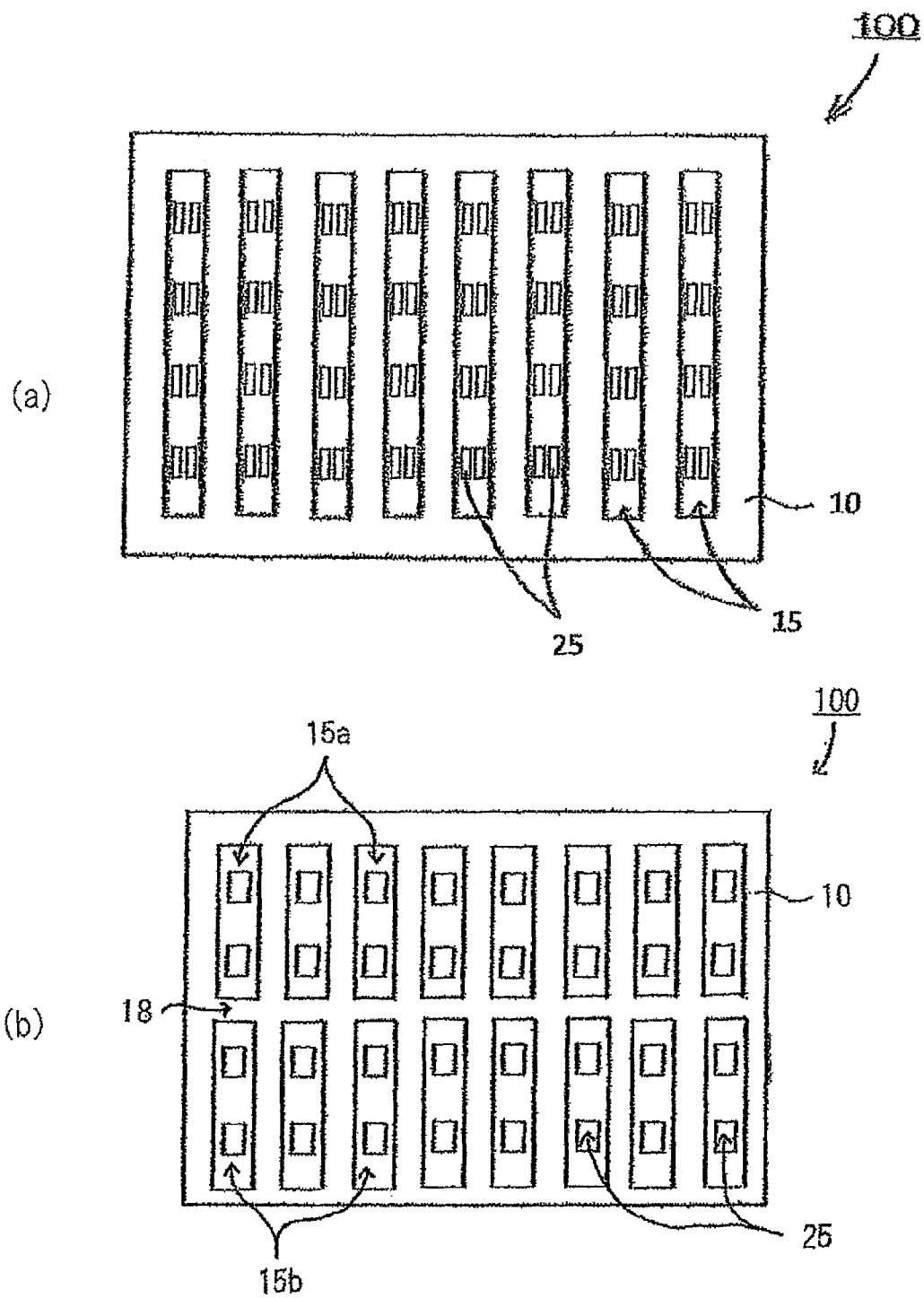
FIGS. 5 (a) and (b) are front views of the vapor deposition mask that is produced according to the production method of the present invention, seen from a metal mask side.

The positions at which the openings 25 are provided and the number of the openings 25 are not specially limited, and a single opening 25 may be provided at a position overlapping the slit 15, or a plurality of openings 25 may be provided in the lengthwise direction, or the crosswise direction. For example, as shown in FIG. 5 (a), when the slit extends in the lengthwise direction, two or more of the openings 25 that overlap the slit 15 may be provided in the crosswise direction.

A sectional shape of the opening 25 is not specially limited, and end surfaces that face each other of the resin mask forming the opening 25 may be substantially parallel with each other, but the sectional shape of the opening 25 is preferably is the shape having broadening toward a vapor deposition source. In other words, the sectional shape of the opening 25 preferably has a taper surface having broadening toward the metal mask 10 side. By making the sectional shape of the opening 25 have the above configuration, a shadow can be prevented from being generated in the pattern that is produced by vapor deposition when vapor deposition is performed with use of the vapor deposition mask of the present invention. While a taper angle θ can be properly set with the thickness or the like of the resin mask 20 taken into consideration, an angle connecting a lower bottom distal end in the opening of the resin mask and an upper bottom distal end in the opening of the same resin mask is preferably within a range from 25° to 65°. In particular, within this range, the angle (θ) is preferably an angle smaller than a vapor deposition angle of a vapor deposition machine to be used. Furthermore, in FIG. 3 (b) and FIG. 4, an end surface 25a that forms the opening 25 shows a linear shape, but the end surface 25a is not limited thereto, and may be in a curved shape protruding outward, namely, a shape of the entire opening 25 may be in a bowl shape. The opening 25 that has the sectional shape like this can be formed by performing multistage laser irradiation that properly adjusts the irradiation position of the laser and irradiation energy of the laser at the time of formation of the opening 25, or changes the irradiation position stepwise.

Further, in the present invention, as the configuration of the vapor deposition mask 100, the resin mask 20 is used. Therefore, when vapor deposition is performed with use of the vapor deposition mask 100, very high heat is applied to the openings 25 of the resin mask 20, and the risk of a gas being generated from end surfaces 25a (see FIG. 3) that form the opening 25 of the resin mask 20 to reduce the degree of vacuum in the vapor deposition apparatus or the like can arise. Accordingly, with this point taken into consideration, the end surfaces 25a that form the opening 25 of the resin mask 20 are preferably provided with a barrier layer 26 as shown in FIG. 3. By forming the barrier layer 26, a gas can be prevented from being generated from the end surfaces 25a that form the opening 25 of the resin mask 20.

As the barrier layer 26, a thin film layer or a vapor deposition layer of an inorganic oxide, an inorganic nitride or a metal can be used. As an inorganic oxide, oxides of aluminum, silicon, indium, tin and magnesium can be used, and as a metal, aluminum or the like can be used. A thickness of the barrier layer 26 is preferably about 0.05 µm to 1 µm. Accordingly, in the production methods of the present invention described in FIG. 1 and FIG. 2, a step of forming the barrier layer 26 as described above may be performed after the vapor deposition mask 80 is obtained.

Furthermore, the barrier layer preferably covers a front surface at the vapor deposition source side, of the resin mask 20. The front surface at the vapor deposition source side, of the resin mask 20 is covered with the barrier layer 26, whereby a barrier property thereof is further enhanced. The barrier layer is preferably formed by various PVD methods and CVD methods in the case of an inorganic oxide and an inorganic nitride. In the case of a metal, the barrier layer is preferably formed by a vacuum vapor deposition method. Note that the front surface at the vapor deposition source side, of the resin mask 20 mentioned here may be the entire front surface at the vapor deposition source side, of the resin mask 20, or may be only portions exposed from the metal mask in the front surface at the vapor deposition source side, of the resin mask 20.

(Metal Mask)

The metal mask 10 is composed of a metal, and the slits 15 that extend in the lengthwise direction or the crosswise direction are arranged in a plurality of rows in the position overlapping the openings 25, in other words, in the position where all of the openings 25 arranged in the resin mask 20 are visible, when seen from a front of the metal mask 10. Note that in FIG. 3, the slits 15 that extend in the lengthwise direction of the metal mask 10 are continuously arranged in the crosswise direction. Further, in the present invention, the example in which the slits 15 that extend in the lengthwise direction or the crosswise direction are arranged in a plurality of rows is cited and described, but the slits 15 may be arranged in only a single row in the lengthwise direction or in the crosswise direction.

While a width W of the slit 15 is not specially limited, the width W is preferably designed to be shorter than at least the pitch between the adjacent openings 25. More specifically, as shown in FIG. 2 (a), when the slit 15 extends in the lengthwise direction, the width W in the crosswise direction of the slit 15 is preferably made shorter than the pitch P1 of the openings 25 adjacent to each other in the crosswise direction. Similarly, though not illustrated, when the slit 15 extends in the crosswise direction, a width in the lengthwise direction of the slit 15 is preferably made shorter than a pitch P2 of the openings 25 adjacent to each other in the lengthwise direction. Meanwhile, a length L in the lengthwise direction in a case of the slit 15 extending in the lengthwise direction is not specially limited, and can be properly designed in accordance with the lengthwise length of the metal mask 10 and the positions of the openings 25 that are provided in the resin mask 20. Accordingly, in the production methods of the present invention described in FIG. 1 and FIG. 2, the metal plate is designed as described above when the metal plate is etched.

Further, the slit 15 that continuously extends in the lengthwise direction, or in the crosswise direction may be divided into a plurality of portions by a bridge 18 as shown in FIG. 5 (b). Note that FIG. 5 (b) is a front view of the vapor deposition mask 100 seen from the metal mask 10 side, and shows an example in which the single slit 15 continuously extending in the lengthwise direction shown in FIG. 3 (a) are divided into a plurality of portions (slits 15a and 15b) by the bridge 18. While a width of the bridge 18 is not specially limited, the width of the bridge 18 is preferably around lam to 20 µm. By setting the width of the bridge 18 to be within this range, the rigidity of the metal mask 10 can be effectively enhanced. The arrangement position of the bridge 18 is not specially limited, but the bridge 18 is preferably arranged in such a manner that the slit after being divided is overlaid on the two or more of the openings 25.

While a sectional shape of the slit 15 that is formed in the metal mask 10 is not specially limited, either, the sectional shape is preferably a shape that has broadening toward the vapor deposition source as shown in FIG. 3, similarly to the opening 25 in the above described resin mask 20. Accordingly, in the production methods of the present invention described in FIG. 1 and FIG. 2, etching is preferably performed so that the sectional shape as described above is obtained when the metal plate is etched.

The material of the metal mask 10 is not specially limited, and the conventionally known material in the field of the vapor deposition mask can be properly selected and used, and, for example, a metal material such as stainless steel, an iron-nickel alloy, and an aluminum alloy can be cited. Above all, an invar material that is an iron-nickel alloy can be preferably used since an invar material is hardly deformed by heat.

Further, when the vapor deposition mask 100 at a front side of the substrate needs to be attracted by a magnetic force by arranging a magnet or the like at a rear side of the substrate when vapor deposition is performed onto the substrate with use of the vapor deposition mask 100 of the present invention, the metal mask 10 is preferably formed of a magnetic substance. As the metal mask 10 of a magnetic substance, pure iron, carbon steel, W steel, Cr steel, Co steel, KS steel, MK steel, NKS steel, Cunico steel, an AL—Fe alloy and the like can be cited. Further, when the material itself that forms the metal mask 10 is not of a magnetic substance, magnetism may be given to the metal mask 10 by dispersing powder of the above described magnetic substance into the material.

While the thickness of the metal mask 10 is not specially limited, the thickness is preferably around 5 µm to 100 µm. In the case of consideration being given to prevention of a shadow at the time of vapor deposition, the thickness of the metal mask 10 is preferably small, but when the thickness of the metal mask 10 is made thinner than 5 µm, the risk of breakage and deformation is increased, and handling is likely to be difficult. However, since in the present invention, the metal mask 10 is integrated with the resin mask 20, the risks of breakage and deformation can be reduced even if the thickness of the metal mask 10 is very small such as 5 µm, and a metal mask is usable if the thickness thereof is 5 lam or more. Note that the case in which the thickness of the metal mask 10 is made larger than 100 µm is not preferable because generation of a shadow can arise. Accordingly, in the production methods of the present invention described in FIG. 1 and FIG. 2, when the metal plate with a resin layer is prepared, the metal plate with a resin layer is preferably prepared with those described above taken into consideration.

Figure 6:
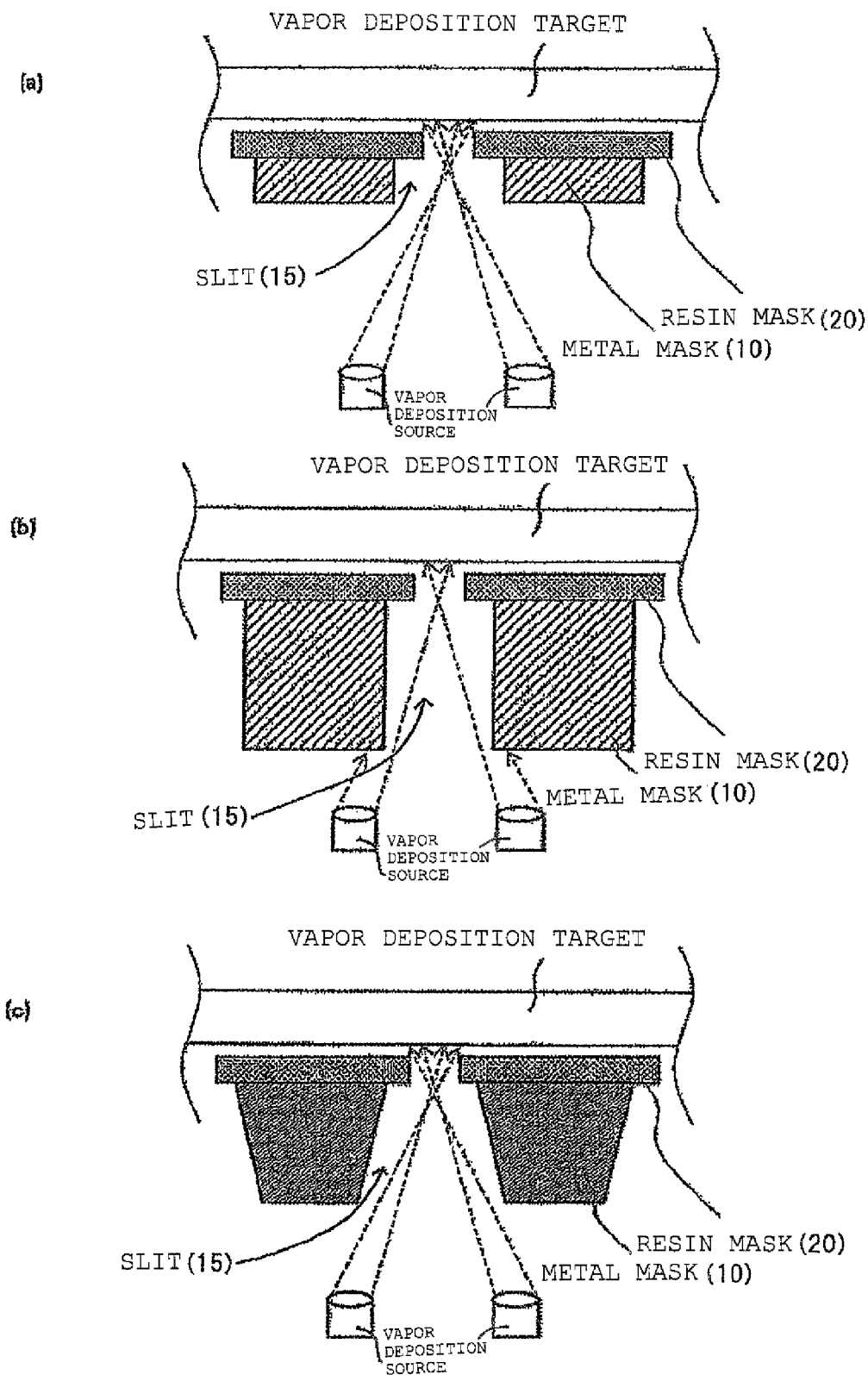
FIG. 6 is a schematic sectional view showing a relation of a shadow and a thickness of the metal mask.

Hereinafter, with use of FIG. 6 (a) to FIG. 6 (c), a relation of generation of a shadow, and the thickness of the metal mask 10 will be specifically described. As shown in FIG. 6 (a), when the thickness of the metal mask 10 is small, the vapor deposition material that is released toward a vapor deposition target from a vapor deposition source passes through the slit 15 of the metal mask 10 and the opening 25 of the resin mask 20 without colliding with an inner wall surface of the slit 15 of the metal mask 10 and a surface of the metal mask 10 at a side where the resin mask 20 is not provided, and reaches the vapor deposition target. Thereby, formation of the vapor deposition pattern with a uniform film thickness onto the vapor deposition target is enabled. Namely, generation of a shadow can be prevented. Meanwhile, as shown in FIG. 6 (b), when the thickness of the metal mask 10 is large, for example, when the thickness of the metal mask 10 is a thickness exceeding 100 µm, a part of the vapor deposition material that is released from the vapor deposition source collides with the inner wall surfaces of the slit 15 of the metal mask 10, and the surface of the metal mask 10 at the side where the resin mask 20 is not formed, and cannot reach the vapor deposition target. As the vapor deposition material that cannot reach the vapor deposition target increases more, an undeposited portion having a film thickness smaller than the intended vapor deposition film thickness occurs to the vapor deposition target more, namely, a shadow is generated.

In order to prevent generation of a shadow sufficiently, the sectional shape of the slit 15 is preferably made a shape having broadening toward the vapor deposition source, as shown in FIG. 6 (c). By adopting the sectional shape like this, the vapor deposition material can be caused to reach the vapor deposition target without the vapor deposition material that is released from the vapor deposition source colliding with the surface of the slit 15 and the inner wall surface of the slit 15 even if the thickness of the entire vapor deposition mask is made large with the objective of prevention of distortion that can occur to the vapor deposition mask 100, or enhancement of durability. More specifically, the angle that is formed by a straight line connecting the lower bottom distal end in the slit 15 of the metal mask 10 and the upper bottom distal end in the slit 15 of the same metal mask 10, and the bottom surface of the metal mask 10 is preferably within a range of 25° to 65°. In particular, in this range, an angle that is smaller than the vapor deposition angle of the vapor deposition machine to be used is preferable. By adopting the sectional shape like this, the deposition material can be caused to reach the vapor deposition target without the vapor deposition material released from the vapor deposition source colliding with the inner wall surface of the slit 15 even when the thickness of the metal mask 10 is made relatively large with the objective of prevention of distortion that can arise in the vapor deposition mask 100, or enhancement of durability. Thereby, generation of a shadow can be prevented more effectively. Note that FIG. 6 is a partial schematic sectional view for explaining the relation of generation of a shadow and the slit 15 of the metal mask 10. Note that in the form shown in FIG. 6 (c), the slit 15 of the metal mask 10 has the shape having broadening toward the vapor deposition source side, and the end surfaces that face each other of the opening of the resin mask 20 are substantially parallel with each other, but in order to prevent generation of a shadow more effectively, the sectional shapes of both the slit of the metal mask 10 and the opening 25 of the resin mask 20 are preferably the shapes having broadening toward the vapor deposition source side. Accordingly, in the method for producing the vapor deposition mask of the present invention, the slit 15 of the metal mask 10 and the opening 25 of the resin mask 20 are preferably produced so that the sectional shapes of the slit of the metal mask and the opening of the resin mask become the shapes having broadening toward the vapor deposition source side.

Figure 7:
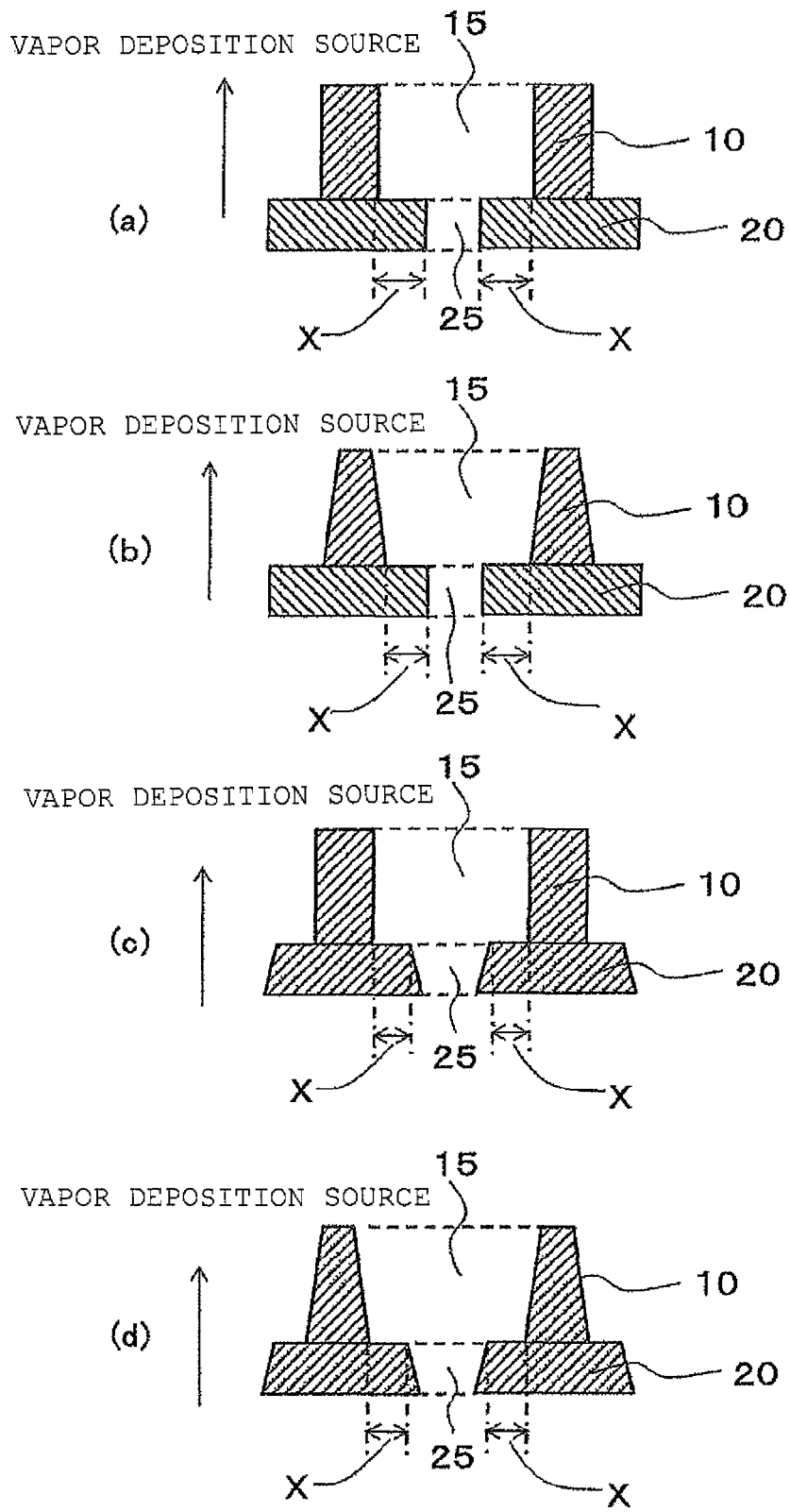
FIG. 7 is a partial schematic sectional view showing a relation of a slit of the metal mask, and an opening of a resin mask.

FIGS. 7 (a) to (d) are partial schematic sectional views showing the relation of the slit of the metal mask and the opening of the resin mask, and in the forms that are illustrated, the sectional shapes of entire openings that are formed by the slits 15 of the metal masks and the openings 25 of the resin masks show step shapes. As shown in FIG. 7, the sectional shapes of the entire openings are formed into step shapes having broadening toward the vapor deposition source sides, whereby generation of a shadow can be prevented effectively.

Accordingly, in the method for producing the vapor deposition mask of the present invention, the vapor deposition mask is preferably produced in such a manner that the sectional shape of the entire opening that is formed by the slit of the metal mask and the opening 25 of the resin mask becomes a step shape.

In the sectional shapes of the slit 15 of the metal mask and the resin mask 20, the end surfaces that face each other may be substantially parallel with each other as shown in FIG. 7 (a), but as shown in FIGS. 7 (b) and (c), only any one of the slit 15 of the metal mask and the opening of the resin mask may have a sectional shape having broadening toward the vapor deposition source side. Note that as described in the above, in order to prevent generation of a shadow more effectively, both of the slit 15 of the metal mask, and the opening 25 of the resin mask preferably have the sectional shapes having broadening toward the vapor deposition source side as shown in FIG. 3 (b) and FIG. 7 (d).

A width of a flat portion (reference sign (X) in FIG. 7) in the section formed into the above described step shape is not specially limited, but when the width of the flat portion (X) is less than 1 μm, the effect of prevention of shadow generation tends to reduce due to interference of the slit of the metal mask. Accordingly, with this point taken into consideration, the width of the flat portion (X) is preferably 1 μm or more. A preferable upper limit value is not specially limited, and can be properly set with consideration given to the size of the opening of the resin mask, the space between the adjacent openings and the like, and as one example, the preferable upper limit value is approximately 20 μm.

Figure 8:
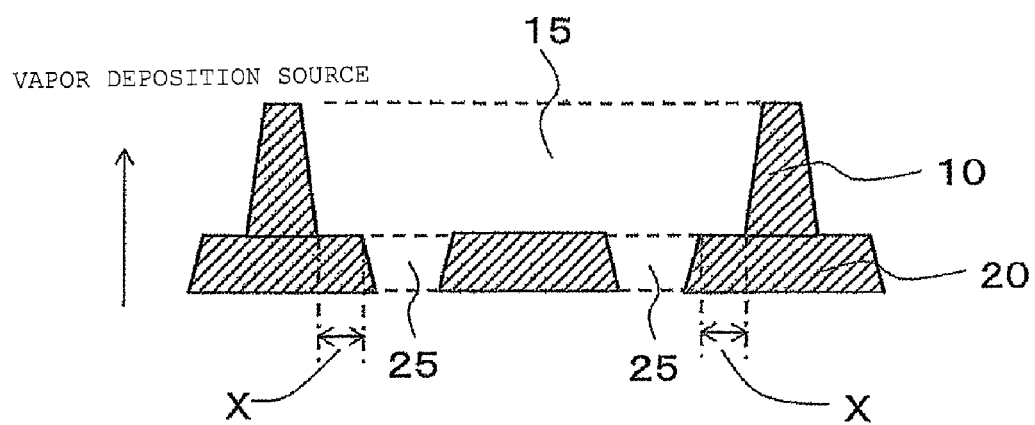
FIG. 8 is a partial schematic sectional view showing a relation of the slit of the metal mask and the opening of the resin mask.

Note that FIGS. 7 (a) to (d) described above each shows an example in which the single opening 25 that overlaps the slit 15 is provided in the crosswise direction when the slit extends in the lengthwise direction, but as shown in FIG. 8, two or more of the openings 25 that overlap the slit 15 may be provided in the crosswise direction when the slit extends in the lengthwise direction. In FIG. 8, both the slit 15 of the metal mask and the opening 25 of the resin mask have sectional shapes having broadening toward the vapor deposition source side, and two or more of the openings 25 that overlap the slit 15 are provided in the crosswise direction.

(Vapor Deposition Mask Produced According to Second Production Method)

Figure 4:
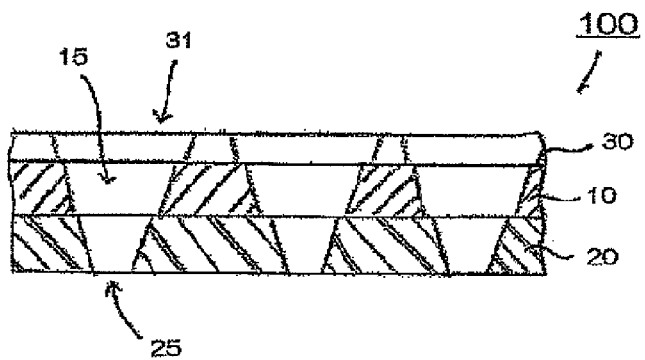
FIG. 4 is an enlarged sectional view of the vapor deposition mask that is produced according to the second production method.

FIG. 4 is an enlarged sectional view of the vapor deposition mask that is produced according to the second production method.

As shown in FIG. 4, the vapor deposition mask 100 produced by the second production method differs from the vapor deposition mask produced by the first production method shown in FIG. 3 in only the point that a resist pattern 30 remains in the vapor deposition mask 100 produced by the second production method, and is the same as the vapor deposition mask produced by the first production method in the other points. Accordingly, explanation of the metal mask 10 and the resin mask 20 will be omitted.

(Resist Pattern)

The resist pattern 30 is a resist pattern that is used as an etching mask when the metal plate is etched, and is composed of a resist material. The pattern is substantially the same as the slits formed in the metal mask 10. Note that the sectional shape of an opening 31 of the resist pattern 30 is preferably made a shape having broadening toward the vapor deposition source as shown in FIG. 4.

Since in the vapor deposition mask that is produced by the second production method like this, both the surfaces of the metal mask are covered with a resin, expansion uniformly occurs in both the surfaces thereof even when the resin is expanded by heat at the time of vapor deposition, and therefore, curl hardly occurs as compared with the case in which a resin is present on only one surface, which is preferable. In order to exhibit the effect efficiently, the materials of both of the resin layer provided on the metal plate and the resist material are preferably selected so that the difference between the thermal coefficients of the material of the resin composing the resin mask, that is the resin layer provided on the metal plate and the material of the resist material composing the resist pattern becomes small.

(Method for Producing Organic Semiconductor Element)

A method for producing an organic semiconductor element of the present invention is characterized by forming an organic semiconductor element by using the vapor deposition mask 100 produced according to the production method of the present invention described in the above. As for the vapor deposition mask 100, the vapor deposition mask 100 produced according to the production method of the present invention described above can be directly used, and therefore, the detailed explanation here will be omitted. According to the vapor deposition mask of the present invention described above, an organic semiconductor element having a pattern with high definition can be formed by the openings 25 with high dimensional precision which are included by the vapor deposition mask 100. As the organic semiconductor element that is produced according to the production method of the present invention, an organic layer of an organic EL element, a light emitting layer, a cathode electrode and the like, for example, can be cited. In particular, the method for producing the organic semiconductor element of the present invention can be favorably used in production of the R, G and B light emitting layers of the organic EL element which are required to have pattern precision with high definition.

REFERENCE SIGNS LIST

100 Vapor deposition mask
10, 66 Metal mask
15 Slit
18 Bridge
20, 70 Resin mask
25 Opening
60 Metal plate with resin layer
61 Metal plate
62 Resist material
64 Resist pattern
67 Resin layer
68 Metal plate with resin layer
80 Vapor deposition mask

The invention claimed is:
1. A method for producing a vapor deposition mask that is formed by a metal mask provided with a slit, and a resin mask that is positioned on a front surface of the metal mask, and has openings corresponding to a pattern to be produced by vapor deposition arranged by lengthwise and crosswise in a plurality of rows being stacked on each other, comprising the steps of:

preparing a metal plate with a resin layer in which a resin layer is provided on one surface of the metal plate;

forming a metal mask with a resin layer by forming a slit that penetrates through only the metal plate, for the metal plate in the metal plate with a resin layer; and forming a resin mask by forming the openings corresponding to a pattern to be produced by vapor deposition in a plurality of rows lengthwise and crosswise in the resin layer by emitting a laser from the metal mask side.

2. The method for producing a vapor deposition mask according to claim 1, wherein the step of forming the metal mask with a resin layer is a step of forming a resist pattern by coating a surface where a resin layer is not provided, of the metal plate with the resin layer, with a resist material, masking the resist material with use of a mask in which a slit pattern is formed, and forming a resist pattern to performing exposure and development, subjecting the metal plate to etching processing with use of the resist pattern as an etching resistant mask, and cleaning and removing the resist pattern after etching is finished.

3. The method for producing a vapor deposition mask according to claim 1, wherein the step of forming the metal mask with a resin layer is a step of forming a resist pattern by coating a surface where a resin layer is not provided, of the metal plate with a resin layer, with a resist material, masking the resist material with use of a mask in which a slit pattern is formed, and forming a resist pattern to performing exposure and development, subjecting the metal plate to etching processing with use of the resist pattern as an etching resistant mask, and allowing the resist pattern to remain on a front surface of the metal plate even after etching is finished.

4. The method for producing a vapor deposition mask according to claim 1, further comprising the step of:

fixing the metal mask with a resin layer onto a frame containing a metal, after the metal mask with a resin layer is obtained in the step of forming the metal mask with a resin layer, wherein after the metal mask with a resin layer is fixed to the frame, the step of forming the resin mask is performed.

5. A method for producing an organic semiconductor element, comprising:

manufacturing the vapor deposition mask that is produced according to the production method according to claim 1.

6. The method for producing a vapor deposition mask according to claim 2, further comprising the step of:

fixing the metal mask with a resin layer onto a frame containing a metal, after the metal mask with a resin layer is obtained in the step of forming the metal mask with a resin layer, wherein after the metal mask with a resin layer is fixed to the frame, the step of forming the resin mask is performed.

7. The method for producing a vapor deposition mask according to claim 3, further comprising the step of:

fixing the metal mask with a resin layer onto a frame containing a metal, after the metal mask with a resin layer is obtained in the step of forming the metal mask with a resin layer, wherein after the metal mask with a resin layer is fixed to the frame, the step of forming the resin mask is performed.

8. A method for producing an organic semiconductor element, comprising:

manufacturing the vapor deposition mask that is produced according to the production method according to claim 2.

9. A method for producing an organic semiconductor element, comprising:

manufacturing the vapor deposition mask that is produced according to the production method according to claim 3.

10. A method for producing an organic semiconductor element, comprising:

manufacturing the vapor deposition mask that is produced according to the production method according to claim 4.

11. A method for producing an organic semiconductor element, comprising:

manufacturing the vapor deposition mask that is produced according to the production method according to claim 6.

12. A method for producing an organic semiconductor element, comprising:

manufacturing the vapor deposition mask that is produced according to the production method according to claim 7.

* * * * *